US008371890B2

(12) United States Patent
Yu

(10) Patent No.: US 8,371,890 B2
(45) Date of Patent: Feb. 12, 2013

(54) ASSEMBLY METHOD OF A LED LAMP

(76) Inventor: Chih-Ming Yu, Hsinchu (TW)

( * ) Notice: Subject to any disclaimer, the term of this patent is extended or adjusted under 35 U.S.C. 154(b) by 8 days.

(21) Appl. No.: 13/290,237

(22) Filed: Nov. 7, 2011

(65) Prior Publication Data

US 2012/0047729 A1 Mar. 1, 2012

Related U.S. Application Data

(62) Division of application No. 12/892,244, filed on Sep. 28, 2010.

(51) Int. Cl.
*H01J 9/00* (2006.01)
*H01L 33/00* (2010.01)

(52) U.S. Cl. ................................ 445/22; 445/26; 445/27

(58) Field of Classification Search .................... 445/22, 445/26, 27; 313/317-318.12; 362/311.02, 362/221, 646
See application file for complete search history.

(56) References Cited

U.S. PATENT DOCUMENTS

| | | | | |
|---|---|---|---|---|
| 5,036,248 | A * | 7/1991 | McEwan et al. | 313/318.01 |
| 6,252,350 | B1 * | 6/2001 | Alvarez | 313/498 |
| 7,976,182 | B2 * | 7/2011 | Ribarich | 362/221 |
| 2006/0050514 | A1 * | 3/2006 | Opolka | 362/294 |
| 2007/0103901 | A1 * | 5/2007 | Reid | 362/234 |
| 2010/0320892 | A1 * | 12/2010 | Yu | 313/46 |
| 2011/0101861 | A1 * | 5/2011 | Yoo | 313/46 |

* cited by examiner

*Primary Examiner* — Mariceli Santiago
(74) *Attorney, Agent, or Firm* — Muncy, Geissler, Olds & Lowe, PLLC

(57) ABSTRACT

Simple, rapid and low-cost assembly methods of a LED lamp are provided. A standard lamp base having two electrodes and a cavity is soldered with a resistor to the first one of the electrodes, and then filled with a thermally conductive electric insulator in the cavity. A circuit board is attached onto the thermally conductive electric insulator and then soldered to the second electrode and the resistor. An LED device is soldered onto the circuit board such that the LED device and the resistor are serially connected between the electrodes. Preferably, the circuit board has a through hole through which a thermally conductive member is inserted into the thermally conductive electric insulator with its lower end, and the LED device is placed onto the upper end of the thermally conductive member.

5 Claims, 6 Drawing Sheets

ASSEMBLY METHOD OF A LED LAMP

CROSS REFERENCE TO RELATED APPLICATION

This application is a divisional of U.S. patent application Ser. No. 12/892,244, filed Sep. 28, 2010, which is a continuation-in-part of U.S. patent application Ser. No. 12/457,718, filed Jun. 19, 2009 and entitled "Heat Dissipation Enhanced LED Lamp," the disclosure of which is hereby incorporated by reference as if set forth fully herein.

FIELD OF THE INVENTION

The present invention is related generally to a LED lamp and, more particularly, to an assembly method of a LED lamp.

BACKGROUND OF THE INVENTION

While LED devices are suitable for use in space-limited applications, heat dissipation remains an issue to be addressed. Ineffective heat dissipation will lead to high temperature that lowers light emission efficiency, causes undesirable wavelength shift, shortens the service life of LEDs, or even burns out the LED chips. This is especially true in high-power applications where LED devices are used for illumination purposes, for these LED devices tend to generate huge heat that, if not dissipated sufficiently, may cause serious problems.

Conventionally, an additional heat dissipation mechanism is provided to deal with the heat generated by the LED devices. However, as the heat dissipation mechanism is bulky, the resultant light bulb is much larger than the traditional ones. Moreover, the heat dissipation mechanism complicates the light bulb structure and requires an extra step of connecting the heat dissipation mechanism to the light bulb, which adds to the difficulty of assembly.

SUMMARY OF THE INVENTION

An object of the present invention is to provide an assembly method of a LED lamp.

According to the present invention, an assembly method of a LED lamp includes preparing a lamp base having a first electrode, a second electrode and a cavity, soldering a resistor to the first electrode, filling the cavity with a thermally conductive electric insulator, attaching a circuit board onto the thermally conductive electric insulator and soldering the circuit board to the second electrode and the resistor, and soldering an LED device onto the circuit board.

According to the present invention, an assembly method of a LED lamp includes preparing a lamp base having a first electrode, a second electrode and a cavity, soldering an electrically conductive wire to the first electrode, filling the cavity with a thermally conductive electric insulator, attaching a circuit board onto the thermally conductive electric insulator and soldering the circuit board to the second electrode and the electrically conductive wire, and soldering an LED device onto the circuit board.

According to the present invention, an assembly method of a LED lamp includes preparing a lamp base having a first electrode, a second electrode and a cavity, soldering a resistor to the first electrode, filling the cavity with a thermally conductive electric insulator, attaching a circuit board having a through hole onto the thermally conductive electric insulator and soldering the circuit board to the second electrode and the resistor, inserting a thermally conductive member into the thermally conductive electric insulator through the through hole, with its first end embedded in the thermally conductive electric insulator and its second end attaching onto the circuit board, placing an LED device onto the second end of the thermally conductive member, and soldering the LED device to the circuit board.

The assembly methods of the present invention are simple and rapid and have low cost in the manufacture of LED lamps, and are particularly suitable for making LED lamps that can directly replace the conventional light bulbs.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 3:
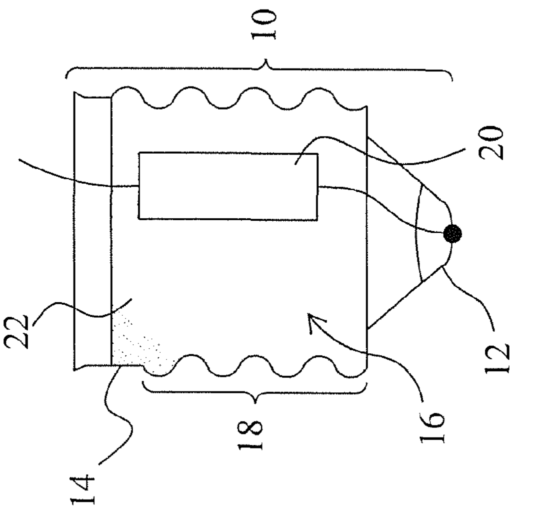
FIGS. 1 through 6 are cross-sectional views showing the steps of a first embodiment according to the present invention.
Figure 1:
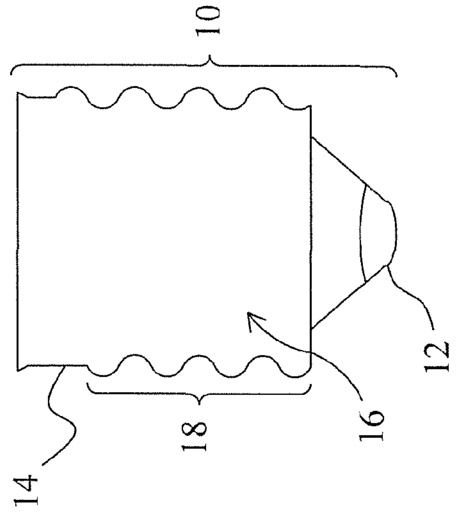
Figure 6:
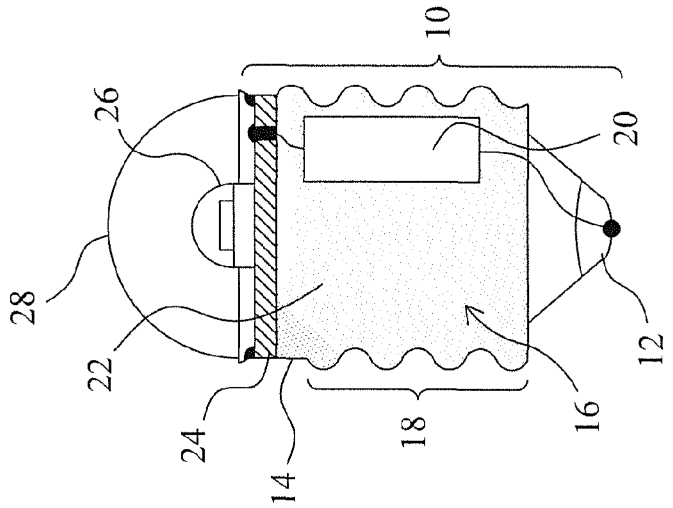
Figure 5:
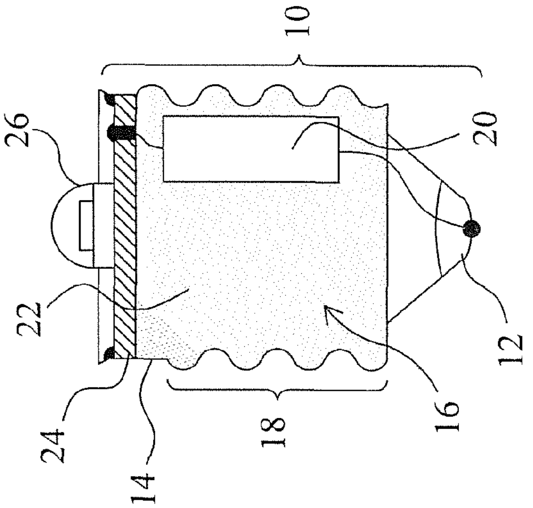
Figure 4:
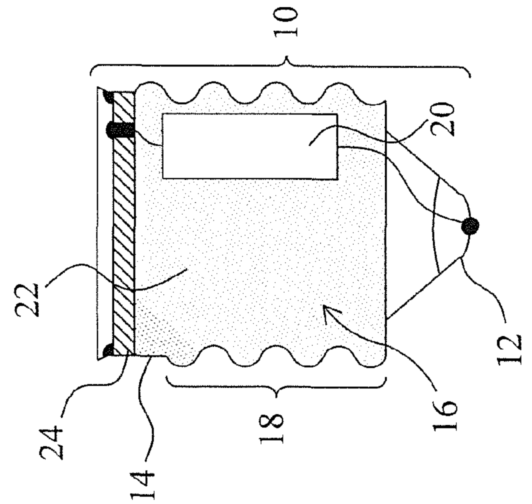

FIGS. 1 through 6 are cross-sectional views showing the steps of a first embodiment according to the present invention. To begin with, a lamp base 10 is prepared as shown in FIG. 1, which has electrodes 12 and 14 and a cavity 16. The lamp base 10 can be selected from the E12, E14, E17, E26 and E27 standard lamp bases of the conventional incandescent light bulbs, the MR16 and GU10 standard lamp bases of the conventional halogen lamps, and other standard lamp bases, all of which lamp bases have two electrodes for connecting with a power source and a cavity therein. If a standard lamp base for the conventional incandescent light bulbs is used, the electrode 14 will have a spiral configuration 18 as shown in FIG. 1. Then, referring to FIG. 2, a resistor 20 is soldered at one end to the electrode 12, and following that, a thermally conductive electric insulator 22 is filled into the cavity 16, as shown in FIG. 3. The thermally conductive electric insulator 22 can be epoxy, thermally conductive powders of aluminum oxide, aluminum nitride, boron nitride or other thermally conductive materials, or a mixture thereof. A thermally conductive electric insulator mixed with epoxy and thermally conductive powders will have higher thermal conductivity than that of either epoxy or thermally conductive powders only. A thermally conductive electric insulator formed by compacting thermally conductive powders also provides good thermal conduction. It is appreciated, however, that the thermally conductive electric insulator 22 may be composed of other materials as well. Preferably, the thermally conductive electric insulator 22 has a thermal conductivity ranging from 0.25 to 30 W/mK. Next, referring to FIG. 4, a circuit board 24 is brought into mechanical contact with the thermally conductive electric insulator 22 and is soldered to the electrode 14, and the other end of the resistor 20 is also soldered to the circuit board 24. As is well known to a person of ordinary skill in the art, the bottom of the circuit board 24 is usually provided with a metal layer to assist in heat dissipation and enable good thermal conduction between the circuit board 24 and the thermally conductive electric insulator 22 to which the circuit board 24 is attached. Lastly, as shown in FIG. 5, an LED device 26 is soldered onto the circuit board 24 in such a way that the LED device 26 and the resistor 20 are connected in series between the electrodes 12 and 14. To accelerate solidification of the thermally conductive electric insulator 22, a heating step may be performed after the LED device 26 is soldered onto the circuit board 24. When the resultant LED lamp is energized to emit light, the thermally conductive electric insulator 22 in the cavity 16 provides a thermal channel for conducting the heat generated by the LED device 26 to the electrode 14 and thereby dissipating the heat. By doing so, the heat generated by the resistor 20, which is now embedded in the thermally conductive electric insulator 22, can also be dissipated. If necessary, a lamp cover 28 can be added to the LED lamp, as shown in FIG. 6. The lamp cover 28 can be made of glass, plastic, epoxy or silicone. If a glass cover or a plastic cover is used, it can be fixed to an end of the lamp base 10 mechanically, such as by gluing, by mortise-and-tenon engagement, and by screw thread engagement. When epoxy or silicone is used, it is directly applied to the top of the circuit board 24 in an amount sufficient to cover the circuit board 24 and all the elements thereon. Besides, the epoxy or silicone may be cured by heating, if necessary.

Figure 9:
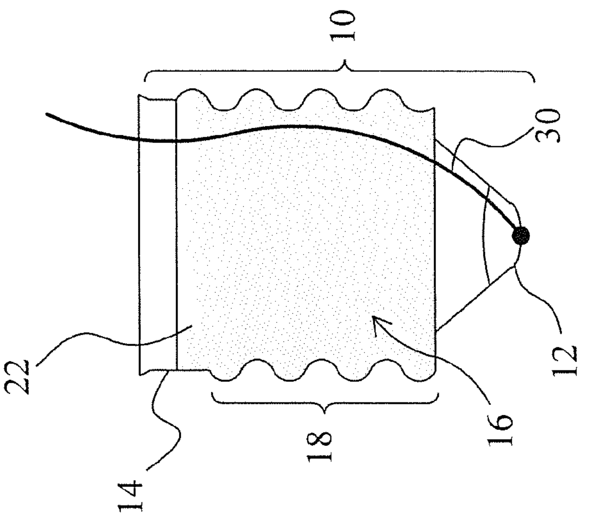
FIGS. 7 through 11 are cross-sectional views showing the steps of a second embodiment according to the present invention.
Figure 8:
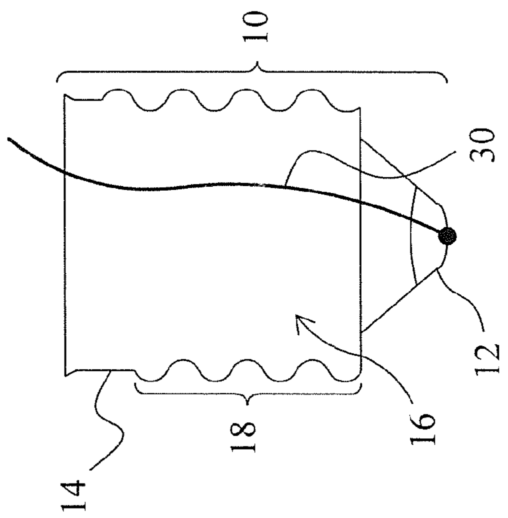
Figure 7:
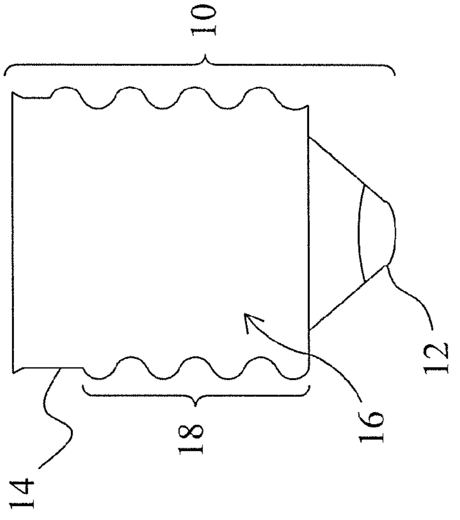
Figure 11:
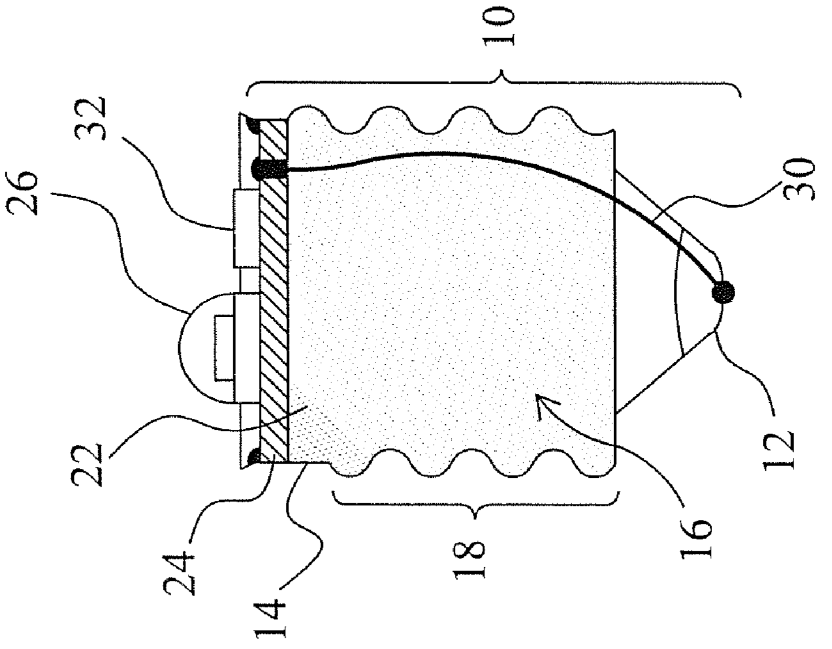
Figure 10:
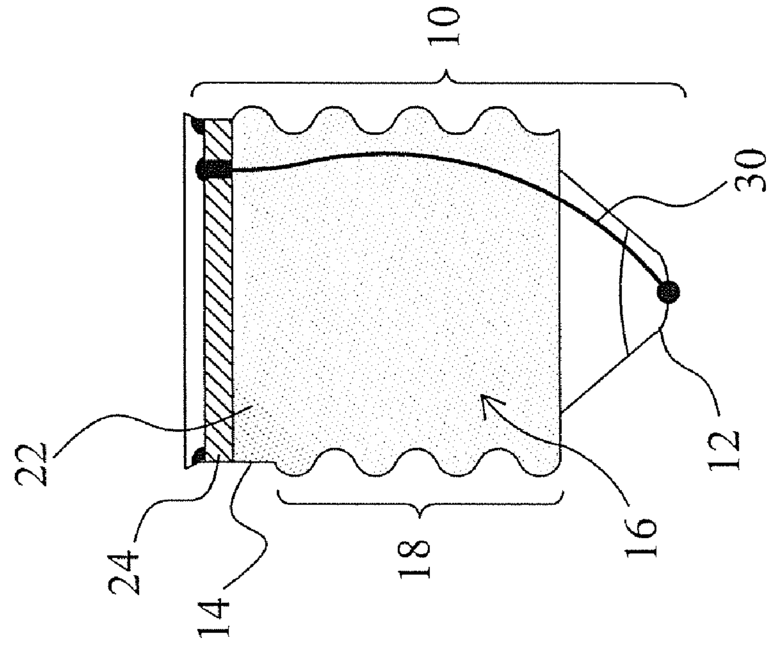

FIGS. 7 through 11 are cross-sectional views showing the steps of a second embodiment according to the present invention. As shown in FIG. 7, a lamp base 10 having electrodes 12, 14 and a cavity 16 is prepared. Then, as shown in FIG. 8, an electrically conductive wire 30 is soldered to the electrode 12, and after that, as shown in FIG. 9, the cavity 16 is filled with a thermally conductive electric insulator 22, and the tail end of the electrically conductive wire 30 is left exposed from the thermally conductive electric insulator 22. Next, referring to FIG. 10, a circuit board 24 is attached onto the top surface of the thermally conductive electric insulator 22 and is soldered to the electrode 14, and the electrically conductive wire 30 is also soldered to the circuit board 24. Lastly, an LED device 26 and a series resistor 32 are soldered onto the circuit board 24, as shown in FIG. 11, such that the LED device 26 and the resistor 20 are connected in series between the electrodes 12 and 14 by the conductive wire 30. If necessary, the thermally conductive electric insulator 22 can be cured by heating after the attachment of the circuit board 24. As the resistor 32 is soldered onto the circuit board 24, a variable resistor can be used as the resistor 32 to increase the flexibility of use. In addition, a lamp cover can be provided as needed, as in the embodiment shown in FIG. 6.

Figure 2:
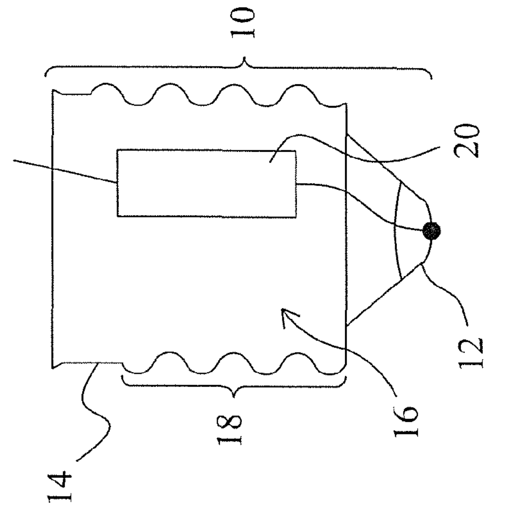
Figure 13:
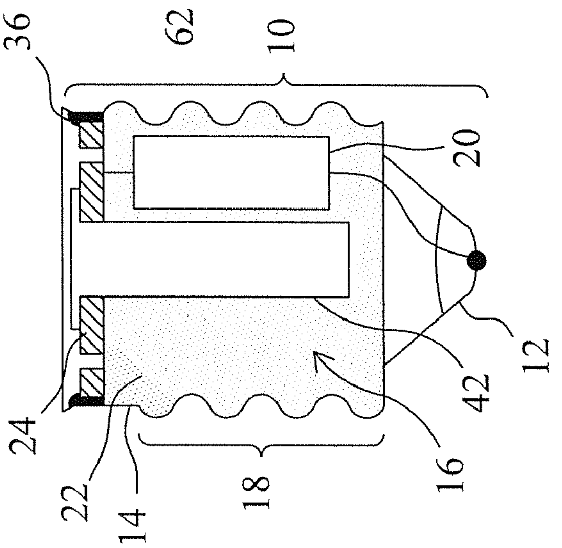
FIGS. 12 through 15 are cross-sectional views showing the steps of a third embodiment according to the present invention.
Figure 12:
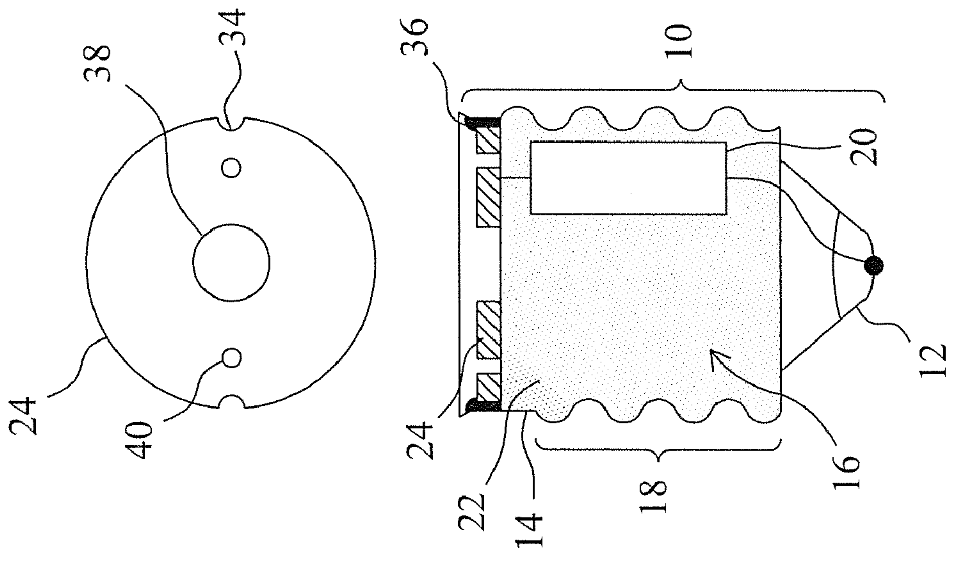
Figure 15:
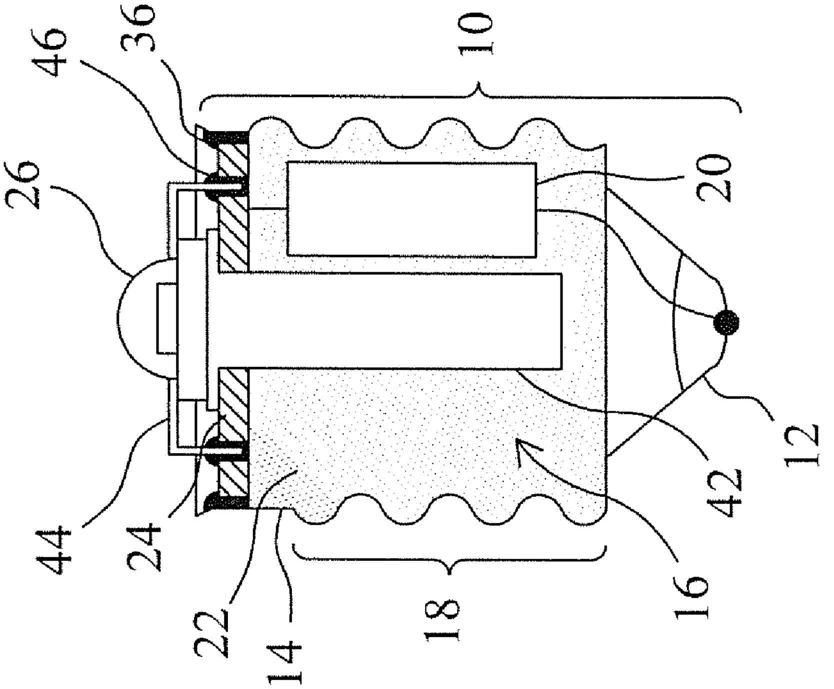
Figure 14:
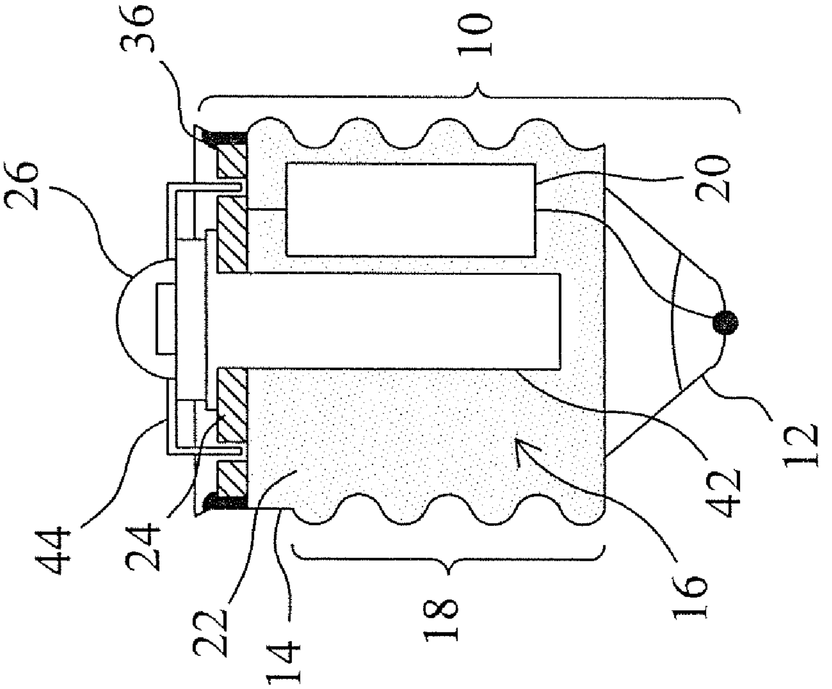

FIGS. 12 through 15 are cross-sectional views showing the steps of a third embodiment according to the present invention. Prior to the step shown in FIG. 12, the steps shown in FIGS. 1 to 3 are performed, and then, referring to FIG. 12, a circuit board 24 is brought into mechanical contact with the thermally conductive electric insulator 22 and is soldered to the electrode 14. The circuit board 24 has through holes 34 and is soldered to the electrode 14 by solder joints 36 at the through holes 34. The other end of the resistor 20 is also soldered to the circuit board 24. The circuit board 24 further has through holes 38 and 40. As shown in FIG. 13, a thermally conductive member 42 is inserted into the thermally conductive electric insulator 22 through the through hole 38 with its lower end embedded in the thermally conductive electric insulator 22 and its upper end attached onto the circuit board 24. The thermally conductive member 42 is made of material having high thermal conductivity, such as copper and other metals, and has a columnar shape, a plate shape, or other suitable shapes. Then, referring to FIG. 14, an LED device 26 is placed onto the exposed end of the thermally conductive member 42, with its pins 44 inserted into the through holes 40 of the circuit board 24. Lastly, the pins 44 of the LED device 26 are soldered to the through holes 40 by solder joints 46, as shown in FIG. 15, such that the LED device 26 and the resistor 20 are connected in series between the electrodes 12 and 14. The through holes 34 and 40 can be replaced by blind holes or other structures, as is well known in the art of circuit boards. If necessary, a lamp cover can be added, as illustrated in the embodiment of FIG. 6. In a different embodiment, the resistor 20 is soldered onto the circuit board 24 instead, or an additional resistor is provided on the circuit board 24 and serially connected to the resistor 20.

The LED device 26 can be selected from commercial products of lamp-type package, plastic leaded chip carrier (PLCC) package, surface-mounted device (SMD) package, chip-on-board (COB) package, or any other type and package structures.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An assembly method of a LED lamp, comprising the steps of:

preparing a lamp base having a first electrode, a second electrode and a cavity;

soldering an electrically conductive wire to the first electrode;

filling the cavity with a thermally conductive electric insulator;

attaching a circuit board onto the thermally conductive electric insulator and soldering the circuit board to the second electrode and the electrically conductive wire; and soldering an LED device onto the circuit board.

2. The assembly method of claim 1, further comprising the step of soldering a resistor onto the circuit board such that the resistor is connected in series to the LED device between the first and second electrodes.

3. The assembly method of claim 1, further comprising the step of heating and thereby curing the thermally conductive electric insulator.

4. The assembly method of claim 1, wherein the circuit board is attached directly to the thermally conductive electric insulator.

5. The assembly method of claim 1, wherein the circuit board is soldered directly to the second electrode.

* * * * *